(12) United States Patent
Choi et al.

(10) Patent No.: US 12,308,213 B2
(45) Date of Patent: May 20, 2025

(54) CORE INSERTION TYPE SPIRAL TUBE AND MAKING METHOD FOR THE SAME

(71) Applicant: SMT CORPORATION, Suwon-si (KR)

(72) Inventors: Hyun Seok Choi, Bucheon-si (KR); Sang Hyo Han, Suwon-si (KR); Jeong Hyun Park, Suwon-si (KR)

(*) Notice: Subject to any disclaimer, the term of this patent is extended or adjusted under 35 U.S.C. 154(b) by 319 days.

(21) Appl. No.: 17/893,202

(22) Filed: Aug. 23, 2022

(65) Prior Publication Data

US 2023/0073639 A1  Mar. 9, 2023

(30) Foreign Application Priority Data

Sep. 3, 2021 (KR) .................. 10-2021-0117405

(51) Int. Cl.
| | |
|---|---|
| *H01J 37/32* | (2006.01) |
| *B32B 1/08* | (2006.01) |
| *B32B 5/20* | (2006.01) |
| *B32B 15/18* | (2006.01) |
| *B32B 37/00* | (2006.01) |

(52) U.S. Cl.
CPC .......... *H01J 37/32477* (2013.01); *B32B 1/08* (2013.01); *B32B 5/20* (2013.01); *B32B 15/18* (2013.01); *B32B 37/0076* (2013.01); *H01J 37/32082* (2013.01); *B32B 2255/06* (2013.01); *B32B 2255/205* (2013.01); *B32B 2266/0207* (2013.01); *B32B 2311/00* (2013.01); *B32B 2311/12* (2013.01); *B32B 2311/30* (2013.01); *B32B 2319/00* (2013.01); *B32B 2457/00* (2013.01); *H01J 2237/0203* (2013.01)

(58) Field of Classification Search
None
See application file for complete search history.

(56) References Cited

U.S. PATENT DOCUMENTS 5,294,373 A * 3/1994 Takahashi ................ C08K 5/14
                                                                252/502

FOREIGN PATENT DOCUMENTS

| CN | 107613745 | * | 1/2018 |
|---|---|---|---|
| JP | 1992-048695 A | | 2/1992 |
| JP | H10200284 | * | 7/1998 |
| JP | 2001-182833 A | | 7/2001 |
| JP | 5514278 B | | 1/2013 |
| KR | 10-2005-0042419 A | | 5/2005 |
| KR | 10-2009-0068846 A | | 6/2009 |
| KR | 10-2012-0089291 A | | 8/2012 |

OTHER PUBLICATIONS

Machine Translation of JPH10200284 (Year: 1998).*
Machine Translation of CN107613745 (Year: 2018).*

* cited by examiner

*Primary Examiner* — Shawn Mckinnon

(57) ABSTRACT

A core insertion type spiral tube includes: a spiral metal tube having an empty space therein; and an elastic core member positioned inside said spiral metal tube.

6 Claims, 6 Drawing Sheets

CORE INSERTION TYPE SPIRAL TUBE AND MAKING METHOD FOR THE SAME

CROSS-REFERENCE TO RELATED APPLICATIONS

This application claims priority to Korean Application No. KR 10-2021-0117405 filed on Sep. 3, 2021, the entire contents of which are herein incorporated by reference in its entirety.

TECHNICAL FIELD

The present invention is related to a core insertion type spiral tube and manufacturing method for the same, and more specifically, is related to a core insertion type spiral tube with improved repetitive elastic properties by inserting a polymer elastic material into a metal spiral tube and manufacturing method for the same.

BACKGROUND ART

Semiconductor manufacturing process equipment using plasma, such as vacuum deposition and dry etching, suffers from severe thermal problems and various electro-magnetic problems due to high plasma density and driving power during process operation. Due to these thermal and electromagnetic problems, the process yield of the silicon wafer is greatly affected, and in particular, it is a major challenge to solve the electromagnetic wave shielding of the upper and lower electrodes to which a high voltage is applied.

FIG. 1 shows a schematic view of a conventional spiral tube (100) used in semiconductor manufacturing process equipment using plasma. As shown in FIG. 1, in the conventional spiral tube (100), an elastic core member (20a) is positioned on an inner side of the spiral metal tube (10); however, since a space is formed between the inner surface of the spiral metal tube (10) and the outer surface of the elastic core member (20a), there is a problem in that the shape of the spiral tube is deformed and elastic force is lowered due to the repetitive pressure application and removal in the metal (such as Al/Ti/Al clad, BeCu, hastelloy, elgiloy, etc.) spiral tube for RF grounding used in the plasma process, which is a semiconductor process.

A lot of research has already been done on a spiral tube that effectively blocks electromagnetic waves. However, there is a need for research on a spiral tube having characteristics that can be used for a long time while maintaining the elastic force of a repeatedly used spiral tube and a method for manufacturing the same.

REFERENCE TO RELATED PATENTS

Related Art Document

Patent Document (Reference 1) Korean Patent Application Publication No. 2012-0089291
(Reference 2) Korean Patent Application Publication No. 2005-0042419
(Reference 3) Korean Patent Application Publication No. 2009-0068846
(Reference 4) Japanese Patent Application Publication No. 1992-048695
(Reference 5) Japanese Patent Application Publication No. 2001-182833
(Reference 6) Japanese Patent Publication No. 5514278

DESCRIPTION OF THE INVENTION

In order to solve the above problems, the present invention aims to improve repetitive elastic properties of a core insertion type spiral tube, which is a metal for RF grounding used in a plasma device that is a semiconductor process, by installing a polymer elastic material to be inserted into a metal spiral tube.

Technical Solution

A core insertion type spiral tube according to an embodiment of the present invention includes a spiral metal tube having an empty space therein; and an elastic core member positioned inside the spiral metal tube.

When the inner diameter of the spiral metal tube is defined as "t" and the diameter of the elastic core member is defined as "d", the diameter "d" of the elastic core member is smaller than or equal to the inner diameter "t" of the spiral metal tube.

When the inner diameter of the spiral metal tube is defined as "t" and the diameter of the elastic core member is defined as "d", the diameter "d" of the elastic core member is larger than the inner diameter "t" of the spiral metal tube.

The elastic core member is a silicone rubber or a silicone rubber filled with inorganic filler, and the elastic core member is processed in a line shape, first foamed, inserted into the spiral metal tube, and second foamed such that the elastic core member is in contact with an inner side of the spiral metal tube.

The spiral metal tube is made of beryllium copper, stainless steel, elgiloy, hasteloy, aastroloy, inconel, rene, udimet, waspaloy, nimonie, incoloy, pyromet, discaloy, or said spiral metal tube is plated with metal selected from gold, tin, nickel, silver, and an alloy thereof.

A core insertion type spiral tube according to an embodiment of the present invention is a metal tube for RF grounding mounted on plasma equipment used in a semiconductor process.

A manufacturing method for a core insertion type spiral tube according to an embodiment of the present invention includes;
 a first step of processing an elastic core member in a line shape;
 a second step of first foaming the elastic core member processed in the line shape;
 a third step of inserting the first foamed elastic core member into an inner side of a spiral metal tube having an empty space therein; and
 a fourth step of second foaming the elastic core member inserted into the inner side of the spiral metal tube.

The elastic core member is a silicone rubber or a silicone rubber filled with inorganic filler.

In the first foaming, the foaming rate of the silicone rubber is 1 to 50%.

In the second foaming, the foaming rate of the silicone rubber is 20 to 100%, and the foaming rate of the silicone rubber in the second foaming is greater than the foaming rate of the silicone rubber in the first foaming.

In the manufacturing method for the core insertion type spiral tube, when the inner diameter of the spiral metal tube is defined as "t" and the diameter of the elastic core member is defined as "d", the diameter "d" of the elastic core member is smaller than or equal to the inner diameter "t" of the spiral metal tube by the second foaming.

In the manufacturing method for the core insertion type spiral tube, when the inner diameter of the spiral metal tube is defined as "t" and the diameter of the elastic core member is defined as "d", the diameter "d" of the elastic core member is larger than the inner diameter "t" of the spiral metal tube by the second foaming.

Effect of the Invention

As described above, the core insertion type spiral tube of the present invention is designed so that the elastic core member is in contact with the inner side of the spiral metal tube in the empty space of the spiral metal tube, such that the repetitive elasticity of the core insertion type spiral tube, which is a spiral tube for RF grounding used in a plasma device that is a semiconductor process, is improved, thereby having an effect of increasing the replacement cycle of the spiral tube.

DETAILED DESCRIPTION

Figure 1:
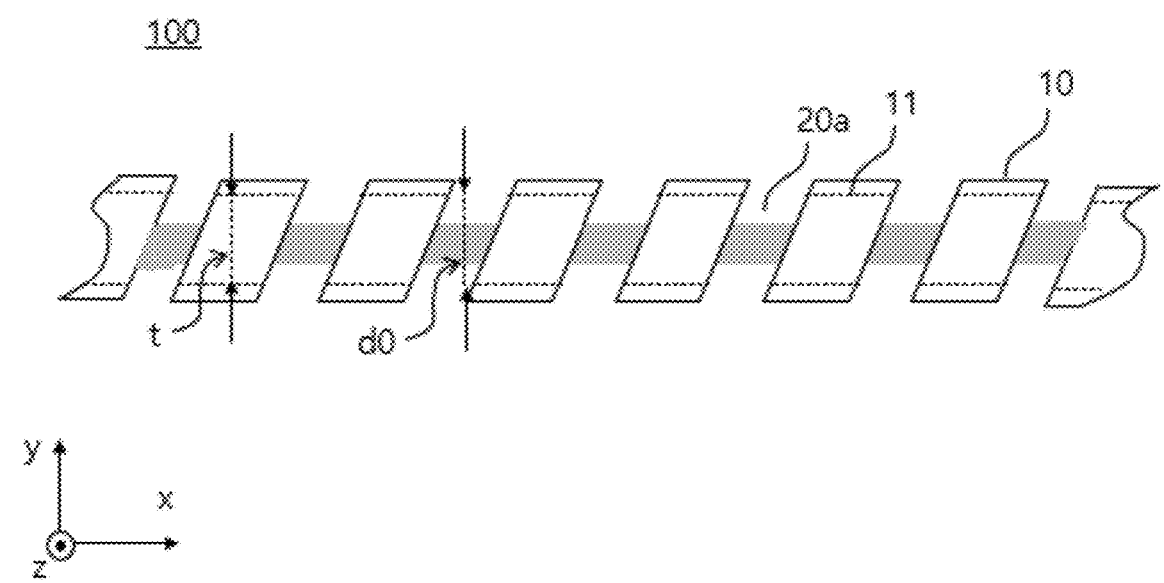
FIG. 1 is a schematic view showing a conventional spiral tube.

In the following drawings, the same reference numerals refer to the same elements, and the size of each element in the drawings may be exaggerated for clarity and convenience of description. Meanwhile, the embodiments described below are merely exemplary, and various modifications are possible from these embodiments. Hereinafter, the term described as "upper portion" or "on" may include not only the meaning "directly on in contact", but also the meaning "on without contact". Terms such as "the first" and "the second", etc. may be used to describe various elements, but the elements should not be limited by the terms. The terms are used only for the purpose of distinguishing one element from another. Singular expressions include plural expressions unless they are explicitly meant differently in context. Also, unless explicitly described to the contrary, the word "comprise" and variations such as "comprises" or "comprising" will be understood to imply the inclusion of stated elements but not the exclusion of any other elements. In addition, terms such as " . . . unit" and "module", etc. described in the specification mean a unit that processes at least one function or operation.

A core insertion type spiral tube according to an embodiment of the present invention includes a spiral metal tube having an empty space therein; and an elastic core member positioned inside the spiral metal tube.

Figure 2:
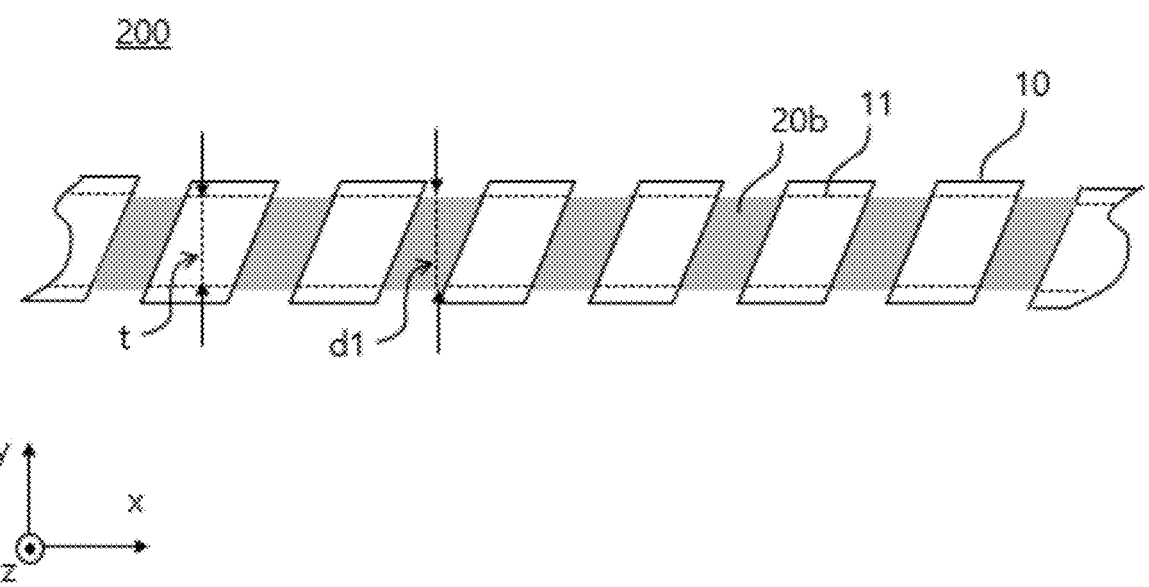
FIG. 2 is a schematic view showing a core insertion type spiral tube according to an embodiment of the present invention.

FIG. 2 shows an embodiment of the core insertion type spiral tube (200) of the present invention. As shown in FIG. 2, the spiral metal tube (10) may be a spiral-shaped metal tube having a predetermined pitch so as to have an empty space therein.

The spiral metal tube (10) may include a conductive material such as a metal or a metal alloy. A metal or a metal alloy may be made of stainless steel, copper alloys (e.g. beryllium copper and copper-chromium-zinc alloys, or copper-iron alloys), or nickel alloys (e.g. elgiloy, hasteloy, aastroloy, inconel, rene, udimet, waspaloy, nimonie, incoloy, pyromet, discaloy). In addition, the surface of the spiral metal tube (10) may be plated with metal selected from gold, tin, nickel, silver, and an alloy thereof. Preferably, the surface of the spiral metal tube may be made of Tin plated Beryllium Copper which is a spiral metal tube (10) of beryllium copper plated with tin, or made of Tin plated Stainless steel #304H which is a stainless steel plated with tin.

As shown in FIG. 2, when the inner diameter of the spiral metal tube (10) is defined as "t" and the diameter of the elastic core member (20b) is defined as "d1", the core insertion type spiral tube (200) of the present invention may be designed so that the diameter "d1" of the elastic core member (20b) is smaller than or equal to the inner diameter "t" of the spiral metal tube (10). More preferably, the diameter "d1" of the elastic core member (20b) may be designed to be equal to the inner diameter "t" of the spiral metal tube (10). That is, the core insertion type spiral tube (200) may satisfy Equation 1 below. Here, d1 may be an average diameter of the elastic core member (20b) inserted into the spiral metal tube (10).

$$d1=t \qquad \text{(Equation 1)}$$

Accordingly, elastic force may be maintained even after long-term use by inserting a rubber-based polymer material having excellent elastic force into the spiral tube in order to maintain a certain level of elastic force even for repetitive pressure application and removal for a long time.

Figure 3:
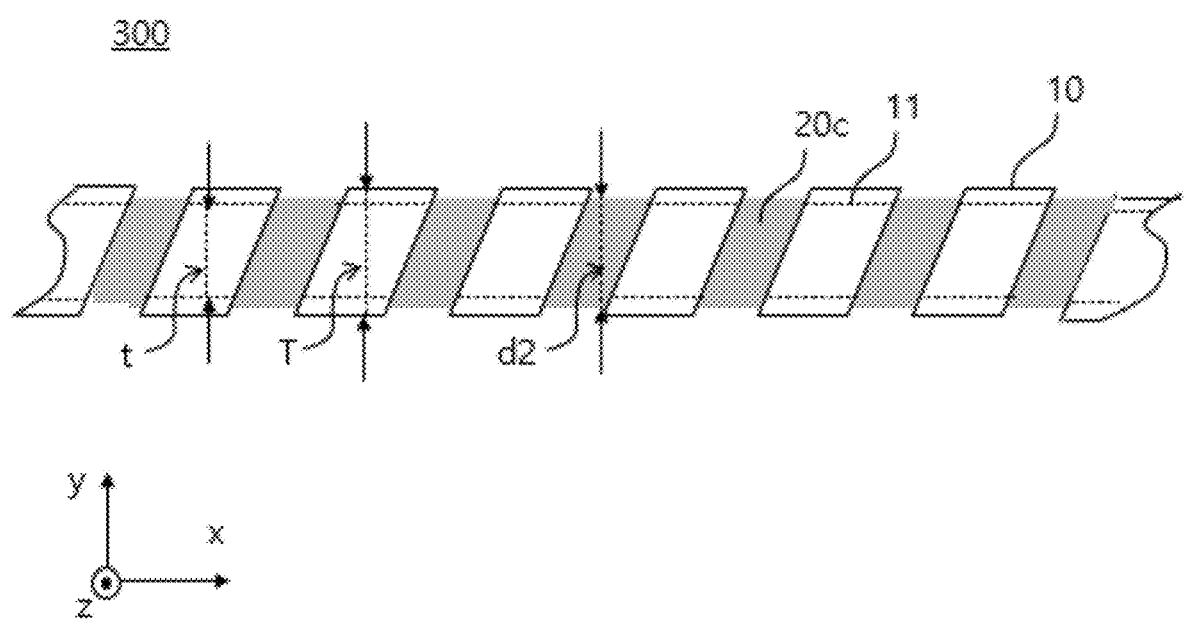
FIG. 3 is a schematic view showing a core insertion type spiral tube according to another embodiment of the present invention.

FIG. 3 shows another embodiment of the core insertion type spiral tube (300) of the present invention. As shown in FIG. 3, when the inner diameter of the spiral metal tube (10) is defined as "t" and the diameter of the elastic core member (20c) is defined as "d2", the core insertion type spiral tube (300) of the present invention may be designed so that the diameter "d2" of the elastic core member (20c) is larger than the inner diameter "t" of the spiral metal tube (10). That is, the core insertion type spiral tube (300) may satisfy Equation 2 below. Here, d2 may be an average diameter of the elastic core member (20c) inserted into the spiral metal tube (10).

$$d2>t \qquad \text{(Equation 2)}$$

That is, when the diameter "d2" of the elastic core member (20c) is designed to be larger than the inner diameter "t" of the spiral metal tube (10), it may be advantageous in maintaining elastic force according to repetitive pressure application and removal than the case where the diameter "d1" of the elastic core member (20c) is designed to be equal to the inner diameter "t" of the spiral metal tube (10) since the outer surface of the elastic core member (20c) comes into contact with the inner surface of the spiral metal tube (10) due to the expansion force of the foamed elastic core member (20c) such that the pressure is applied.

On the other hand, the diameter "d2" of the elastic core member (20c) is preferably designed to be smaller than the outer diameter "t" of the spiral metal tube (10). For example, when the diameter "d2" of the elastic core member (20c) is designed to be equal to or larger than the outer diameter "t" of the spiral metal tube (10), the initial elastic force for repetitive pressure application and removal for a long time may be maintained, however, since the elastic core member (20c) protrudes into the space formed between the pitches of the spiral metal tube (10), there is a problem in that it is difficult to obtain the desired elasticity of the spiral tube and bending of the spiral tube becomes also difficult.

The elastic core members (20b and 20c) used in the spiral tube of the present invention may be made of a rubber polymer material. For example, any one rubber polymer material selected from a silicone rubber, a natural rubber, a nitrile rubber, a styrene-butadiene rubber, a butyl rubber, an ethylene-propylene rubber, a hypalon rubber, an acrylic rubber, and a fluoro rubber may be used. In addition, the elastic core members (20b and 20c) used in the spiral tube of the present invention may be made of a composite rubber filled with inorganic filler (e.g., a metal filler, a ceramic filler, a carbon-based filler, a metal-ceramic composite filler, a metal filler with an organic material surface coating, a ceramic filler with an organic material surface coating, a metal-ceramic composite filler with an organic material surface coating, etc.). In the present invention, it is preferable to use a silicone rubber or a silicone rubber filled with inorganic filler from the viewpoint of having a high coefficient of friction, excellent fire resistance, stain resistance and abrasion resistance, and excellent elasticity.

The elastic core members (20b and 20c) are processed in a line shape, first foamed, inserted into the inside of the spiral metal tube (10), and are second foamed such that the elastic core members (20b and 20c) may be formed in contact with the inner surface (11) of the spiral metal tube.

Hereinafter, a manufacturing method for a core insertion type spiral tube will be described in detail with reference to the drawings.

Figure 4:
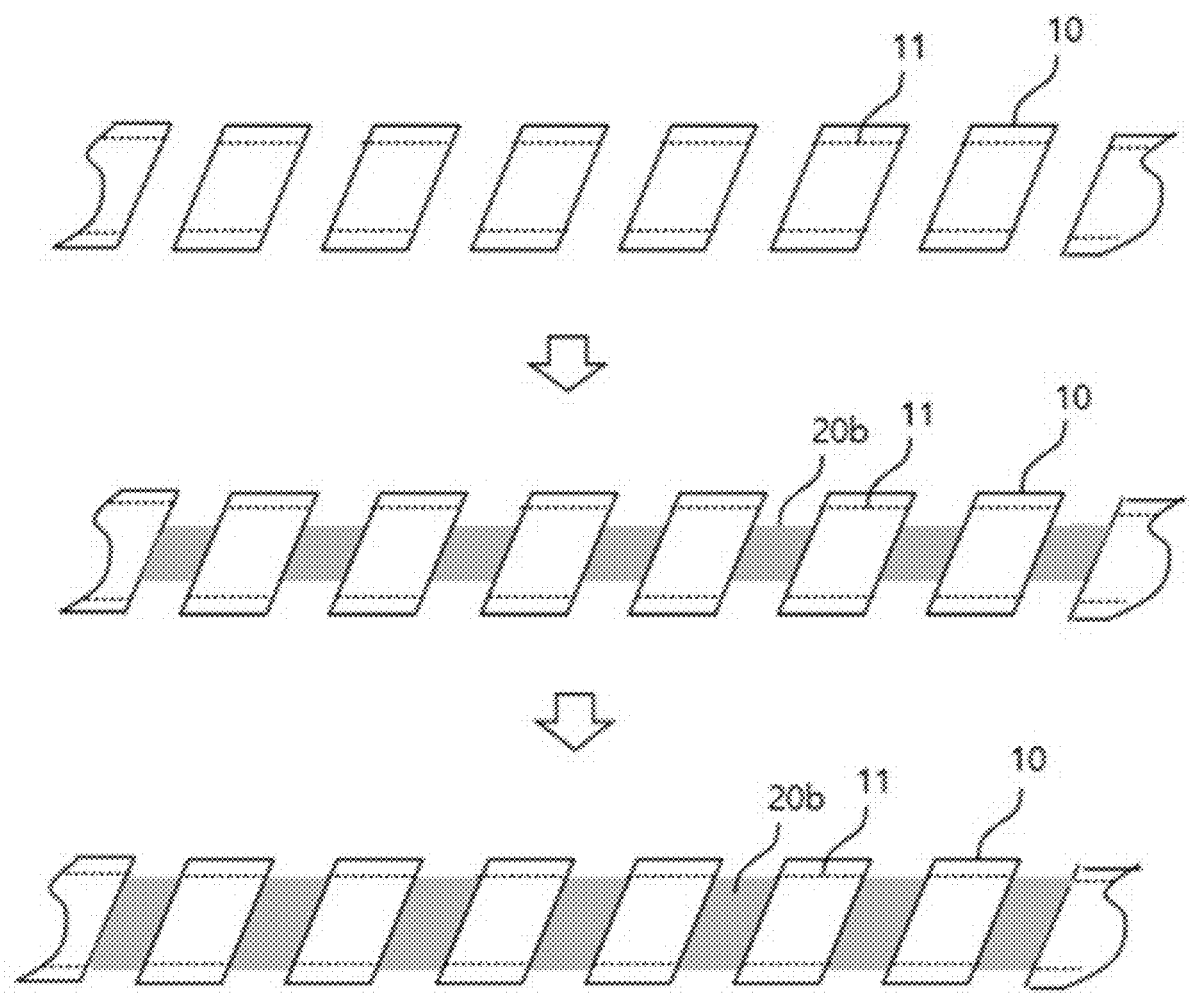
FIG. 4 is a schematic view showing a process for manufacturing a core insertion type spiral tube according to an embodiment of the present invention.
Figure 5:
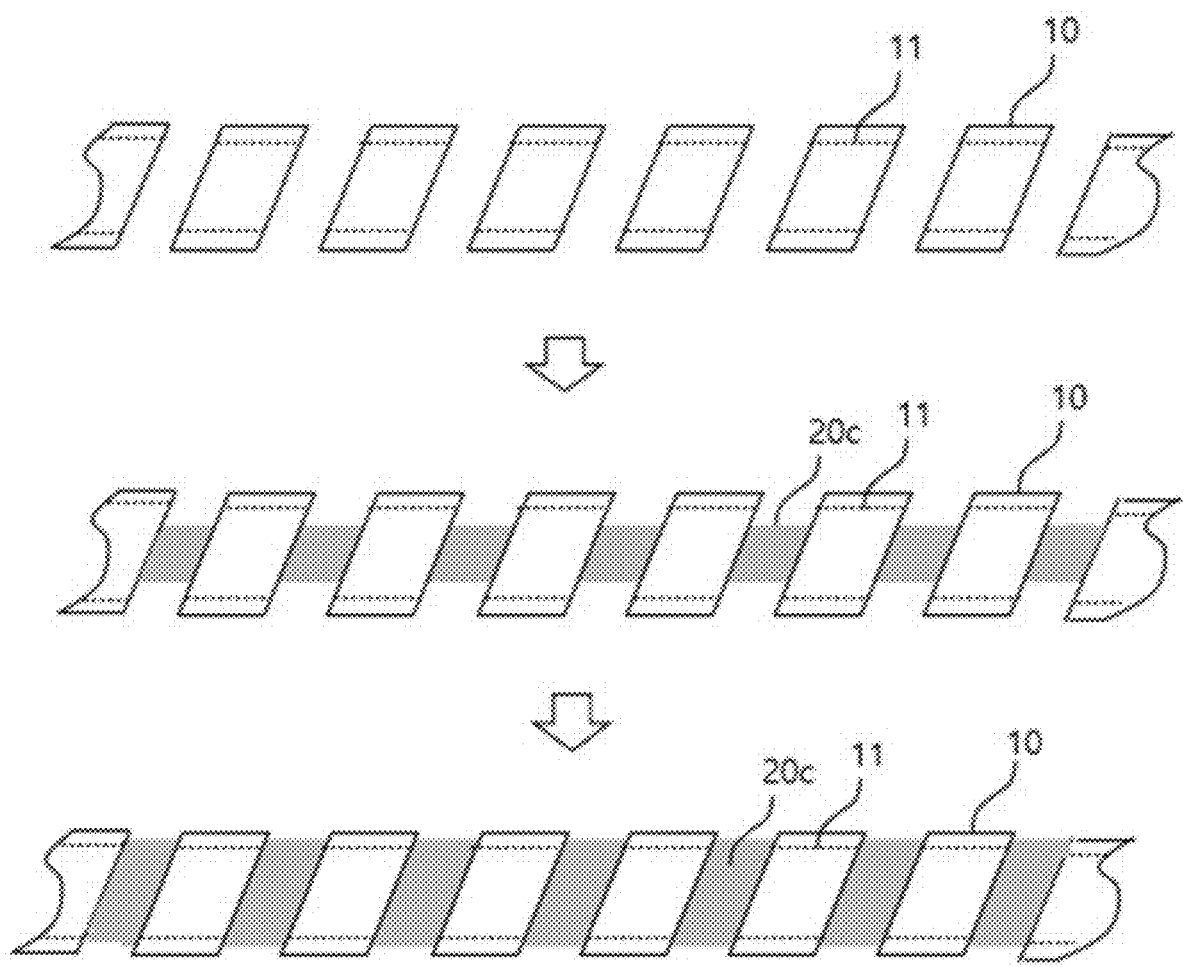
FIG. 5 is a schematic view showing a process for manufacturing a core insertion type spiral tube according to another embodiment of the present invention.
Figure 6:
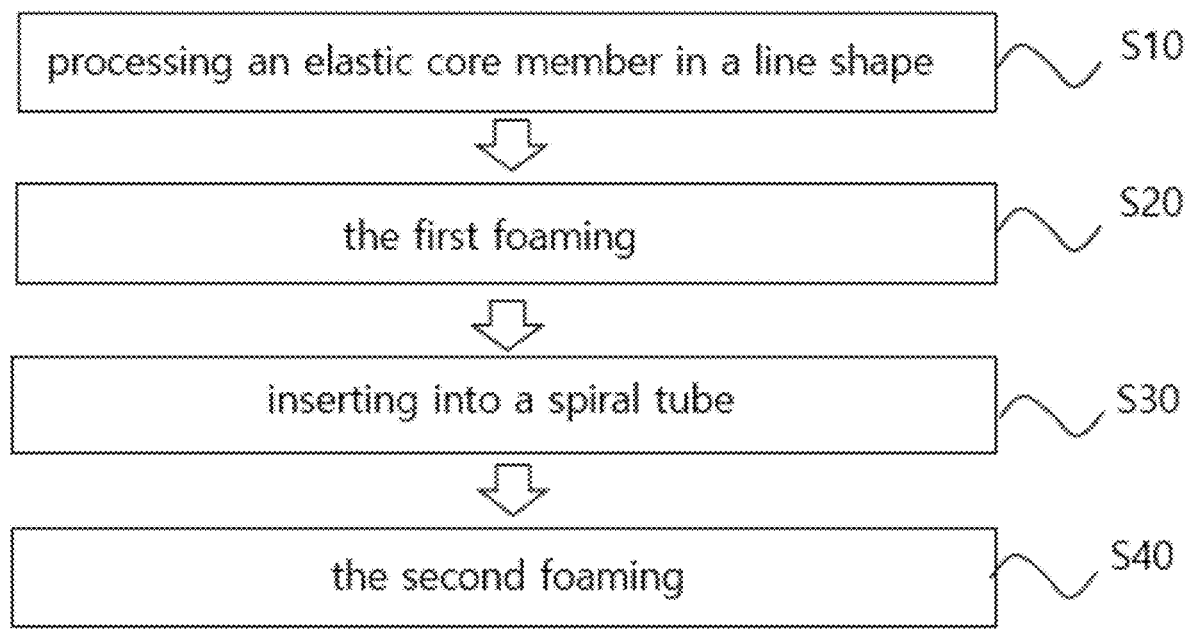
FIG. 6 is a flowchart showing a process for manufacturing a core insertion type spiral tube according to an embodiment of the present invention.

FIG. 4 is a schematic view showing a process for manufacturing a core insertion type spiral tube according to an embodiment of the present invention in the case that the diameter "d1" of the elastic core member is designed to be equal to the inner diameter "t" of the spiral metal tube. FIG. 5 is a schematic view showing a process for manufacturing a core insertion type spiral tube according to another embodiment of the present invention in the case that the diameter "d2" of the elastic core member is designed to be larger than the inner diameter "t" of the spiral metal tube. FIG. 6 is a flowchart showing a process for manufacturing a core insertion type spiral tube according to an embodiment of the present invention.

The manufacturing method for the core insertion type spiral tube according to the present invention includes;
a first step of processing an elastic core member in a line shape (S10);
a second step of first foaming the elastic core member processed in the line shape (S20);
a third step of inserting the first foamed elastic core member into an inner side of a spiral metal tube having an empty space therein (S30); and
a fourth step of second foaming the elastic core member inserted into the inner side of the spiral metal tube (S40).

As the elastic core members (20b and 20c), a silicone rubber or a silicone rubber filled with inorganic filler may be used. Since the specific material of the elastic core members (20b and 20c) is the same as described above, it is omitted here. Here, the foaming rate indicates the degree to which the silicone rubber is foamed, for example, 0% means no foaming at all, and 100% means a fully foamed state.

In the first foaming, the foaming rate of the silicone rubber is 1 to 50%, preferably 10 to 40%. In the secondary foaming, the foaming rate of the silicone rubber is 20 to 100%, preferably 30 to 70%. Here, the foaming rate of the silicone rubber in the secondary foaming is greater than that of the silicone rubber in the first foaming. For example, when the foaming rate of the silicone rubber in the first foaming is 10% or more and 30% or less, the foaming rate of the silicone rubber in the second foaming may be more than 30% and less than 70%.

In the second step, the first foaming may be performed at a foaming rate of 1 to 50% based on the silicone rubber before foaming. If the first foaming is performed on the silicone rubber before foaming, the surface adhesion of the silicone rubber processed in a line shape may be lowered. When inserting into the spiral metal tube (10) without the first foaming, the frictional force with the side surface of the spiral metal tube (10) is increased due to the adhesion of the silicone rubber itself and thus it is not preferable. Therefore, after lowering the surface adhesion of the silicone rubber processed in the line shape through the first foaming, the foamed silicone rubber processed in the line shape may be inserted into the empty space inside the spiral metal tube (10).

Next, in the fourth step, the second foaming may be performed on the silicone rubber processed in the line shape through the first foaming and inserted into the empty space inside the spiral metal tube (10). Here, the second foaming may be performed at a foaming rate of the silicone rubber of 20 to 100% based on the silicone rubber before the first foaming.

If it is less than the foaming rate range above, it is not preferable since the adhesion of the silicone rubber is not lowered, and if it is larger than the foaming rate range above, it is difficult to maintain the elastic force of the foamed silicone rubber, and accordingly, in the first foaming, the foaming rate of the silicone rubber is preferably 1 to 50%, and in the second foaming, the foaming rate of the silicone rubber is preferably 20 to 100%. Here, the foaming rate of the silicone rubber of the second foaming is greater than that of the foaming rate of the silicone rubber of the first foaming.

For foaming of the silicone rubber of the present invention, a known method may be used, for example, a foam such as polyorganosiloxane may be used, but it is not limited thereto.

As described above, although the present invention has been described with reference to limited embodiments and drawings, the present invention is not limited to the above embodiments, and various modifications and variations from these descriptions are possible by those skilled in the art to which the present invention pertains.

Therefore, the scope of the present invention should not be limited to the described embodiments and should be determined by the claims described below as well as those equivalent to the claims.

DESCRIPTION OF SYMBOLS (100) Spiral tube
(200), (300) Core insertion type spiral tube
(10) Spiral metal tube
(11) Inner side of the spiral metal tube
(20a), (20b), (20c) Elastic core member

What is claimed is:

1. A manufacturing method for a core insertion type spiral tube, comprising:
   a first step of processing an elastic core member in a line shape;
   a second step of first foaming the elastic core member processed in the line shape;
   a third step of inserting said first foamed elastic core member into an inner side of a spiral metal tube having an empty space therein; and
   a fourth step of second foaming the elastic core member inserted into the inner side of said spiral metal tube.

2. The manufacturing method for the core insertion type spiral tube of claim 1, wherein said elastic core member is a silicone rubber or a silicone rubber filled with inorganic filler.

3. The manufacturing method for the core insertion type spiral tube of claim 2, wherein in said second step of first foaming, a foaming rate of said silicone rubber is 1 to 50%.

4. The manufacturing method for the core insertion type spiral tube of claim 3, wherein
   in said fourth step of second foaming, a foaming rate of said silicone rubber is 20 to 100%,
   the foaming rate of the silicone rubber in said fourth step of second foaming is greater than the foaming rate of the silicone rubber in said second step of first foaming.

5. The manufacturing method for the core insertion type spiral tube of claim 1, wherein,
   an inner diameter of said spiral metal tube is defined as "t" and a diameter of said elastic core member is defined as "d",
   the diameter "d" of said elastic core member obtained by said second foaming is equal to or larger than the inner diameter "t" of said elastic spiral metal tube.

6. The manufacturing method for the core insertion type spiral tube of claim 1, wherein,
   the core insertion type spiral tube is a metal tube for RF grounding mounted on a plasma equipment used in a semiconductor process.

* * * * *